(12) United States Patent
Sakaguchi

(10) Patent No.: US 6,479,324 B2
(45) Date of Patent: Nov. 12, 2002

(54) METHOD AND MANUFACTURING PIEZOELECTRIC DEVICE

(75) Inventor: Kenji Sakaguchi, Komatsu (JP)

(73) Assignee: Murata Manufacturing, Co., Ltd., Kyoto (JP)

( * ) Notice: Subject to any disclaimer, the term of this patent is extended or adjusted under 35 U.S.C. 154(b) by 0 days.

(21) Appl. No.: 09/917,994

(22) Filed: Jul. 30, 2001

(65) Prior Publication Data

US 2002/0022345 A1 Feb. 21, 2002

(30) Foreign Application Priority Data

Aug. 14, 2000 (JP) .................................... 2000-245802

(51) Int. Cl.[7] .................. H01L 21/44; H01L 21/48; H01L 21/50
(52) U.S. Cl. .................................... 438/113; 438/460
(58) Field of Search ............................... 438/113, 460, 438/FOR 386; 148/DIG. 28

(56) References Cited

U.S. PATENT DOCUMENTS

| | | | | |
|---|---|---|---|---|
| 5,521,123 A | * | 5/1996 | Komatsu et al. | 438/64 |
| 5,668,033 A | * | 9/1997 | Ohara et al. | 148/DIG. 12 |
| 5,699,134 A | * | 12/1997 | Takeda et al. | 349/40 |
| 5,824,177 A | * | 10/1998 | Yoshihara et al. | 156/250 |
| 6,171,163 B1 | * | 1/2001 | Seko et al. | 428/200 |
| 6,271,102 B1 | * | 8/2001 | Brouillette et al. | 438/113 |
| 6,294,439 B1 | * | 9/2001 | Sasaki et al. | 438/113 |

* cited by examiner

Primary Examiner—George Fourson
Assistant Examiner—Michelle Estrada
(74) Attorney, Agent, or Firm—Keating & Bennett, LLP

(57) ABSTRACT

A method for efficiently and inexpensively manufacturing a piezoelectric element that contains highly corrosion resistant electrodes and has excellent and stable electric characteristics is performing such that dicing occurs without forming any protective film beforehand. According to the method, a wafer is formed to have an electrode including an Al alloy disposed on a piezoelectric substrate made of a piezoelectric material. The wafer is cut while being exposed to plasma using a halogen-containing gas while cooling the wafer with cutting water. The cutting water preferably includes a compound that reacts with Al to form a protective film on a surface of an electrode including an Al alloy.

21 Claims, 4 Drawing Sheets

FREQUENCY (MHz)

METHOD AND MANUFACTURING PIEZOELECTRIC DEVICE

BACKGROUND OF THE INVENTION

1. Field of the Invention

The present invention relates to a method of manufacturing a piezoelectric element such as a surface acoustic wave device, and more specifically, the present invention relates to an improvement to a method of manufacturing individual piezoelectric elements by dicing a wafer having electrodes, which include Al or Al alloy, on a piezoelectric substrate.

2. Description of the Related Art

When manufacturing piezoelectric elements such as a surface acoustic wave device, a mother wafer is first prepared and then is diced to obtain individual piezoelectric elements in order to improve mass productivity. More specifically, electrodes made of Al or Al alloy are formed on a piezoelectric substrate consisting of a piezoelectric material to form a wafer, and the individual piezoelectric elements are obtained by dicing the wafer.

When dicing the wafer, a method for dicing the wafer while cooling the wafer with cutting water has been popular. However, fragments and cutting dust from the piezoelectric material are generated from the piezoelectric substrate during the dicing, which results in the fragments of the piezoelectric material being adhered to surfaces of electrodes. In addition, a portion of the piezoelectric material is dissolved in the cutting water, which corrodes the electrodes. As a result, the characteristics of the piezoelectric elements produced according to this method are degraded.

In order to solve the above-described problem, a protective film such as a passivation film consisting of $SiO_2$ is disposed on a surface having the electrodes of the wafer formed thereon before dicing occurs.

However, in the above-described method for forming the protective film, problems occur in that an unnecessary process for forming a protective film for the finished piezoelectric elements must be added, a manufacturing process becomes complicated, and the cost is increased.

In addition, even when the protective film is formed, the electrical characteristics of the obtained piezoelectric elements are sometimes lower than design values, or the non-defective ratio is not sufficiently high, possibly due to the adhesion of powders of the piezoelectric material generated by dicing the wafers.

Further, when using a wafer having electrodes thereon by forming a metal film consisting of an Al alloy on the piezoelectric substrate and etching the metal film with plasma using a halogen-containing gas such as $CF_4$ and $Cl_2$, or a wafer having a frequency that is trimmed by etching the substrate after forming the electrodes, a halogen element such as Cl and F works as an oxidizing agent, and a problem occurs in that the electrodes are corroded.

SUMMARY OF THE INVENTION

In order to overcome the problems described above, preferred embodiments of the present invention provide a method of manufacturing a piezoelectric element that produces piezoelectric elements having excellent characteristics and with an excellent non-defective ratio without forming any protective films before dicing.

According to a preferred embodiment of the present invention, a method of manufacturing a piezoelectric element includes the steps of forming an electrode including an Al alloy on a piezoelectric substrate made of a piezoelectric material, forming a piezoelectric element by exposing the electrode to plasma using a halogen-containing gas, and dicing the wafer while cooling the wafer with cutting water, wherein the cutting water includes a compound for reacting with Al to form a protective film on a surface of the electrode.

At least one kind of phosphoric acid and phosphate is preferably used for the compound that is included in the cutting water, and at least one material selected from the group consisting of calcium hydrogenphosphate, calcium dihydrogenphosphate and sodium hydrogenphosphate is preferably used for the phosphate.

In addition, the first and second preferred embodiments can be preferably used when a surface acoustic wave device is manufactured as the piezoelectric element.

Other features, elements, characteristics and advantages of the present invention will become more apparent from the following detailed description of preferred embodiments with reference to the attached drawings.

DETAILED DESCRIPTION OF PREFERRED EMBODIMENTS

Figure 1A:
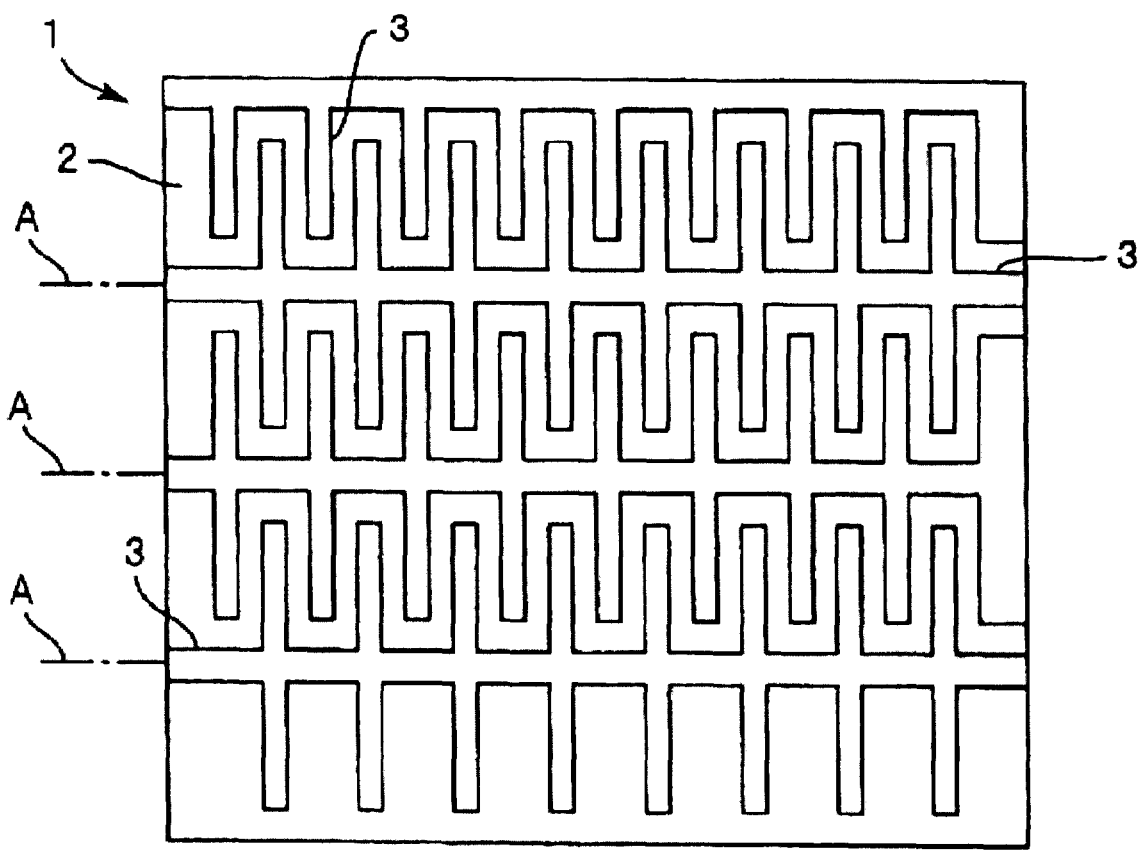
FIGS. 1A and 1B are a plan view of a wafer to be prepared according to a preferred embodiment of the present invention, and a cross-sectional view thereof through the line B—B, respectively.
Figure 1B:
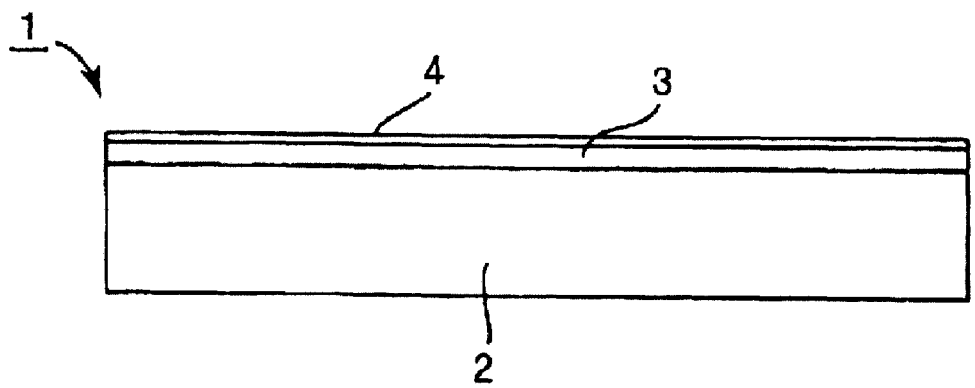

The present invention will be described in detail with reference to preferred embodiments thereof.

In various preferred embodiments of the present invention, an electrode including an Al alloy is disposed on a piezoelectric substrate that is preferably made of or includes a piezoelectric material. Then the wafer having electrodes thereon is etched using a halogen-containing gas to adjust the frequency characteristics of the surface acoustic wave device.

The piezoelectric material constituting the piezoelectric substrate is not specially limited, and a piezoelectric single crystal such as $LiTaO_3$, $LiNbO_3$ and quartz, or a piezoelectric ceramic such as a titanate zirconate lead ceramic may be used. Other suitable materials may also be used.

The material constituting the electrodes provided on the piezoelectric substrate is not specially limited either so long as it is an Al alloy, and an Al—Cu alloy, an Al—Ti alloy or other suitable material can also be used.

The electrodes including an Al alloy are etched using the halogen-containing gas. The halogen-containing gas is not specially limited, and for example, the halogen-containing gas that has been generally used in the etching of electrodes of a piezoelectric element and substrates include $CF_4$, $Cl_2$ and $BCl_3$.

The specific etching method of the electrodes is not limited, and any known method can be appropriately applied according to the shape of the electrode of a desired piezoelectric element.

In various preferred embodiments of the present invention, the piezoelectric element can be obtained by dicing the wafer while cooling it with cutting water. Any conventional dicing device having a dicing saw can be used.

During the dicing, cutting water is applied to a cutting section of the wafer. The cutting water used during dicing preferably includes a compound that reacts with Al to form an insulating film on the surface of an electrode. Such a compound is not specially limited so long as it reacts with Al to form an insulating film, and the use of phosphates such as calcium hydrogenphosphate ($CaHPO_4$) calcium dihydrogenphosphate $Ca(H_2PO_4)_2$ and sodium hydrogenphosphate ($NaHPO_4$), or phosphoric acid can be illustrated.

Similarly, the concentration of the compound to form the insulating film can be appropriately determined according to the material of the compound so long as the insulating film can be formed. The concentration of the compound is generally about $1 \times 10^{-5}$ mol % to about $1 \times 10^{-3}$ mol %.

The temperature of the cutting water for dicing is determined to cool the wafer, and is generally about 15° C. to about 30° C.

In preferred embodiments of the present invention, dicing is achieved while cooling the wafer using cutting water including the above-described compound. Since the compound is included in the cutting water, the compound reacts with Al in the electrode including an Al alloy to form an insulating film on the surface of the electrode. For example, when calcium hydrogenphosphate is used for the compound, an insulating film including aluminum phosphate ($AlPO_4$) is formed on the surface of the electrode.

Thus, the surface of the electrode is covered by the insulating film and protected thereby, the corrosion of the electrode attributable to any halogen element can be effectively suppressed even when the halogen element such as F and Cl remains after the etching using the halogen-containing gas. Even when the electrode is etched using the halogen-containing gas, a piezoelectric element with much less easily degradable electric characteristics can be provided.

Various preferred embodiments of the present invention will be specifically described with reference to the following non-limiting examples.

A wafer 1 shown in FIG. 1A is obtained by forming a metal film with a thickness of about 300 μm including an Al—Cu alloy disposed on the entire surface of a $LiTaO_3$ single crystal substrate with a thickness of about 0.35 mm, and dry-etching the substrate. In the wafer 1, interdigital electrode transducers 2 including an Al—Cu alloy are provided on a piezoelectric substrate 2.

Next, the wafer 1 is diced along a one-dot chain line A in FIG. 1A to obtain individual piezoelectric elements. When dicing the wafer, a calcium hydrogenphosphate aqueous solution set to the temperature of about 25° C. was used for the cutting water in which calcium hydrogenphosphate ($CaHPO_4$) is dissolved in water at a concentration of approximately $1 \times 10^{-4}$ mol %.

Figure 2:
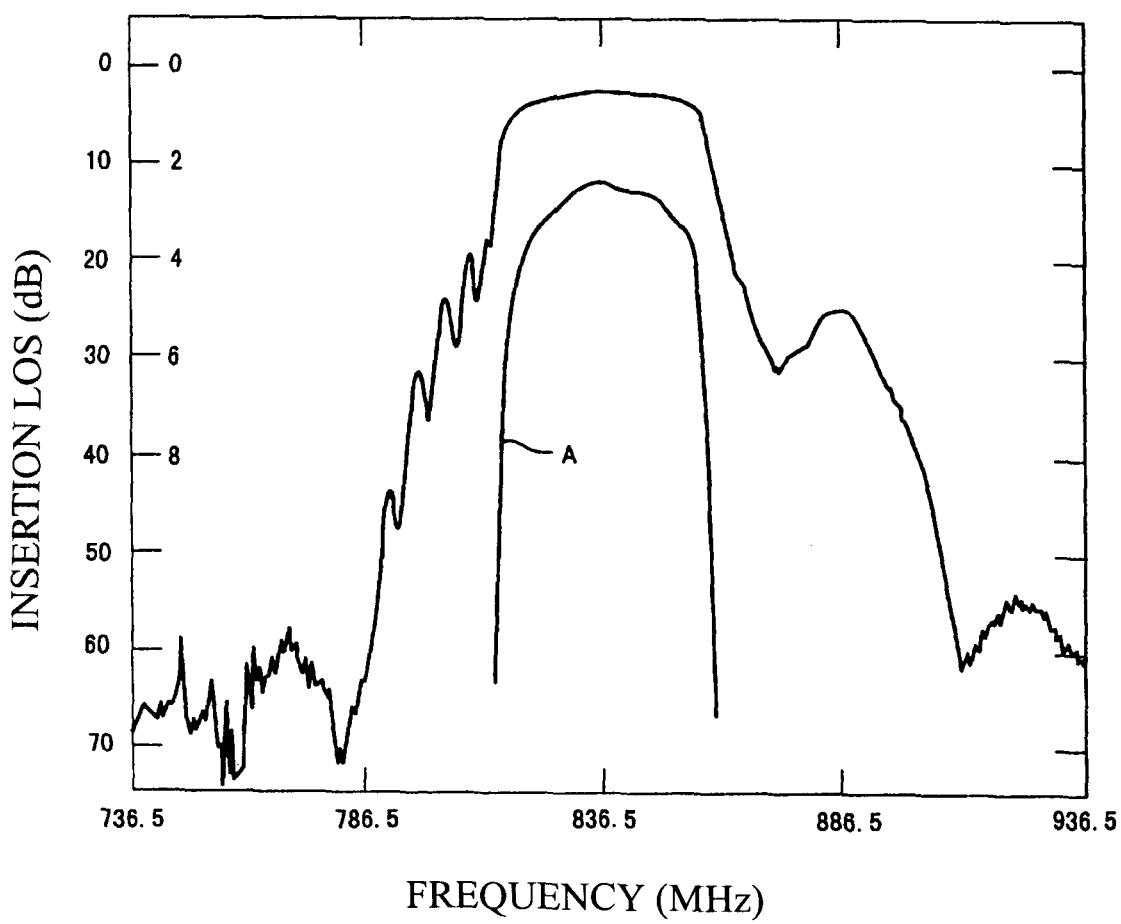
FIG. 2 is a graph showing the attenuation-frequency characteristic of a surface acoustic wave device obtained in Example 1.

As described above, the wafer 1 is diced, and a surface acoustic wave device is produced including a piezoelectric element. FIG. 2 shows the frequency characteristic of the surface acoustic wave device. The solid line A in FIG. 2 indicates an expanded characteristic using the scale on the side of the vertical axis.

Figure 3:
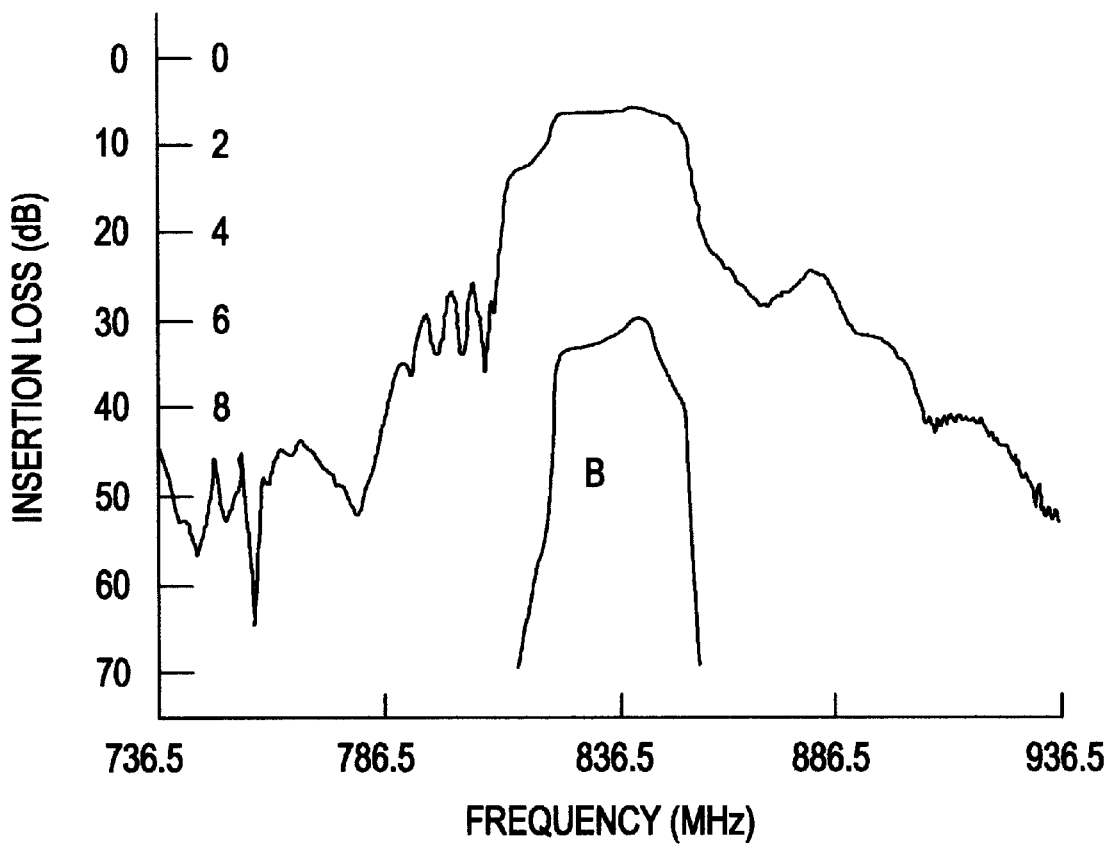
FIG. 3 is a graph showing the attenuation-frequency characteristic of a surface acoustic wave device obtained in Comparative Example 1

For comparison, the surface acoustic wave device was obtained by dicing the wafer 1 similar to the above-described method except that pure water containing no calcium hydrogenphosphate was used as the cutting water. FIG. 3 shows the frequency characteristic thus obtained by the Comparative Example 1. The solid line B in FIG. 3 indicates an expanded characteristic using the scale on the right side of the vertical axis.

As clearly shown in the comparison between FIGS. 2 and 3, the surface acoustic wave device according to Example 1 can increase the band width and reduce the variance in insertion loss in the pass band compared with the Comparative Example 1.

In other examples, a metal film with a thickness of about 200 μm including an Al—Cu alloy was formed on the entire surface of a piezoelectric substrate made of a crystal with a thickness of about 0.35 mm, and then, interdigital electrode transducers 2 shown in FIG. 1A were formed by wet etching. Then, the substrate was exposed to $CF_4$ plasma to etch the portions of the substrate that are not covered by the metal, and the frequency was trimmed. The thus-obtained wafer 1 was diced similar to Example 1 to obtain the surface acoustic wave device.

For comparison, the surface acoustic wave device in Comparative Example 2 was obtained similar to the above-described Example 2 except that the $NaHCO_3$ aqueous solution was used as the cutting water in place of the $CaHPO_4$ aqueous solution.

The surface of the electrode was analyzed by XPS on the surface acoustic wave device according to Example 2 to detect compounds of P and Al. No calcium was detected. It was thus ascertained that Al reacted with calcium hydrogenphosphate to form a corrosion-resistant ($AlPO_4$) film.

Figure 4:
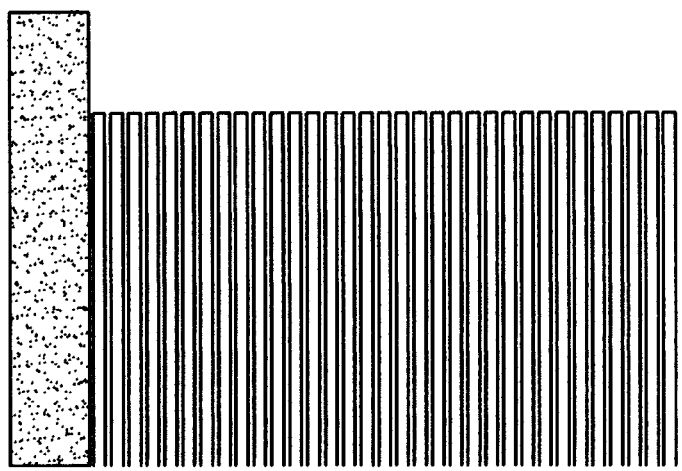
FIG. 4 is a photo showing a shape of an electrode of the surface acoustic wave device obtained in Example 2.
Figure 5:
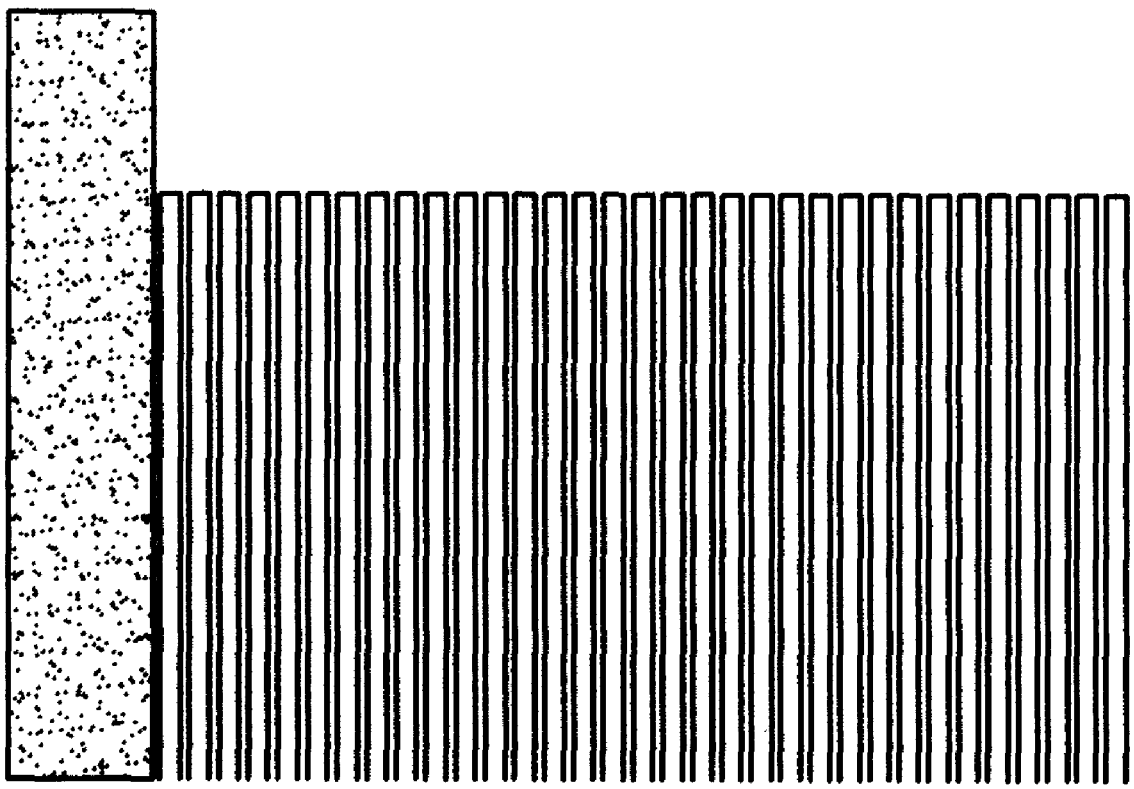
FIG. 5 is a photo showing a shape of an electrode of the surface acoustic wave device obtained in Comparative Example 2.

FIGS. 4 and 5 show photos of the IDT of each surface acoustic wave device according to Example 2 and the Comparative Example 2. As clearly shown in the comparison between FIGS. 4 and 5, it is understood that the quality of the electrodes is greatly improved by the compound of P and Al in Example 2 using a $CaHPO_4$ aqueous solution compared with that in Comparative Example 2.

In the first preferred embodiment of the present invention, the cutting water containing the compound which reacts with Al to form an insulating film on the surface of the electrodes including an Al alloy, and the insulating film is formed when dicing wafers. Thus, the corrosion of electrodes is prevented by the insulating film.

The electrodes are etched using the halogen-containing gas, and even when the halogen element remains, the corrosion of electrodes by the halogen element is reliably prevented by the insulating film, and a piezoelectric element with excellent and stable electric characteristics is reliably provided.

Further, in a conventional method, a $SiO_2$ protective film or other protective film must be formed before the dicing in order to prevent corrosion of the electrodes, while such a protective film need not be formed at all in the first preferred embodiment of the present invention. Thus, piezoelectric elements with excellent characteristics can be efficiently and inexpensively supplied in preferred embodiments of the present invention.

When at least one of the compounds included in the cutting water selected from a group comprising calcium hydrogenphosphate, calcium dihydrogenphosphate, phosphoric acid and sodium dihydrogenphosphate is used, these compounds react with Al to form a stable insulating film on the surface of the electrodes, and corrosion of the electrodes is further reliably prevented.

The types of piezoelectric elements that are applicable to the present invention are not specially limited. However, digital electrodes of the surface acoustic wave device having a large number of small digital electrodes are easily corroded, and preferred embodiments of the present invention are effectively used in this type of piezoelectric element.

While the present invention has been particularly shown and described with reference to preferred embodiments thereof, it will be understood by those skilled in the art that the foregoing and other changes in form and details can be made without departing from the spirit and scope of the present invention.

What is claimed is:

1. A method of manufacturing a piezoelectric element, comprising the steps of:
   providing a wafer made of a piezoelectric material and having an electrode that includes Al or an Al alloy; and
   dicing the wafer while applying cutting water to a cutting portion of the wafer, the cutting water including a compound that reacts with Al to form a protective film on a surface of the electrode.

2. A method of manufacturing a piezoelectric element according to claim 1, further comprising the step of exposing the wafer to a plasma including a halogen gas, before the dicing step.

3. A method of manufacturing a piezoelectric element according to claim 2, wherein the electrode is etched during the exposing step.

4. A method of manufacturing a piezoelectric element according to claim 1, wherein the compound is selected from the group consisting of phosphoric acid, hydrogenphosphates and dihydrogenphosphates.

5. A method of manufacturing a piezoelectric element according to claim 1, wherein the cutting water includes the compound having a concentration within about $1 \times 10^{-5}$ mol % to about $1 \times 10^{-3}$ mol %.

6. A method of manufacturing a piezoelectric element according to claim 1, wherein the compound is selected from the group consisting of calcium hydrogenphosphate, calcium dihydrogenphosphate and sodium hydrogenphosphate.

7. A method of manufacturing a piezoelectric element according to claim 1, wherein the wafer is made of a material selected from the group consisting of quartz, $LiTaO_3$ and $LiNbO_3$.

8. A method of manufacturing a piezoelectric element according to claim 1, wherein said piezoelectric element constitutes a surface acoustic wave device.

9. A method of manufacturing a piezoelectric element according to claim 1, wherein the electrode is made of one of an Al alloy, an Al—Cu alloy, and an Al—Ti alloy.

10. A method of manufacturing a piezoelectric element according to claim 2, wherein the halogen-containing gas is one of $CF_4$, $Cl_2$ and $BCl_3$.

11. A method of manufacturing a piezoelectric element according to claim 1, wherein the temperature of the cutting water used during the dicing step is about 15° C. to about 30° C.

12. A method of manufacturing a piezoelectric element, comprising the steps of:
    providing a piezoelectric substrate;
    forming an electrode that includes Al or an Al alloy on the piezoelectric substrate by exposing the wafer to a plasma including a halogen gas; and
    dicing the wafer while applying cutting water to a cutting portion of the wafer, the cutting water including a compound that reacts with Al to form a protective film on a surface of the electrode.

13. A method of manufacturing a piezoelectric element according to claim 12, wherein the electrode is etched during the exposing of the wafer to the plasma including the halogen gas.

14. A method of manufacturing a piezoelectric element according to claim 12, wherein the compound is selected from the group consisting of phosphoric acid, hydrogenphosphates and dihydrogenphosphates.

15. A method of manufacturing a piezoelectric element according to claim 12, wherein the cutting water includes the compound having a concentration within about $1 \times 10^{-5}$ mol % to about $1 \times 10^{-3}$ mol %.

16. A method of manufacturing a piezoelectric element according to claim 12, wherein the compound is selected from the group consisting of calcium hydrogenphosphate, calcium dihydrogenphosphate and sodium hydrogenphosphate.

17. A method of manufacturing a piezoelectric element according to claim 12, wherein the wafer is made of a material selected from the group consisting of quartz, $LiTaO_3$ and $LiNbO_3$.

18. A method of manufacturing a piezoelectric element according to claim 12, wherein said piezoelectric element constitutes a surface acoustic wave device.

19. A method of manufacturing a piezoelectric element according to claim 12, wherein the electrode is made of one of an Al alloy, an Al—Cu alloy, and an Al—Ti alloy.

20. A method of manufacturing a piezoelectric element according to claim 12, wherein the halogen-containing gas is one of $CF_4$, $Cl_2$ and $BCl_3$.

21. A method of manufacturing a piezoelectric element according to claim 12, wherein the temperature of the cutting water used during the dicing step is about 15° C. to about 30° C.

* * * * *